(12) United States Patent
Reed

(10) Patent No.: US 11,417,551 B2
(45) Date of Patent: Aug. 16, 2022

(54) MELT DETECTION SYSTEMS AND METHODS OF USING THE SAME

(71) Applicant: Veeco Instruments Inc., Plainview, NY (US)

(72) Inventor: Matthew Earl Wallace Reed, San Jose, CA (US)

(73) Assignee: Veeco Instruments Inc., Plainview, NY (US)

(*) Notice: Subject to any disclaimer, the term of this patent is extended or adjusted under 35 U.S.C. 154(b) by 102 days.

(21) Appl. No.: 16/946,648

(22) Filed: Jun. 30, 2020

(65) Prior Publication Data

US 2021/0013070 A1    Jan. 14, 2021

Related U.S. Application Data

(60) Provisional application No. 62/871,877, filed on Jul. 9, 2019.

(51) Int. Cl.
| | | |
|---|---|---|
| H01L 21/324 | (2006.01) | |
| H01L 21/263 | (2006.01) | |
| H01L 21/67 | (2006.01) | |
| H01L 21/268 | (2006.01) | |
| H01L 21/673 | (2006.01) | |
| H01L 21/66 | (2006.01) | |

(52) U.S. Cl.
CPC ...... *H01L 21/67248* (2013.01); *H01L 21/268* (2013.01); *H01L 21/324* (2013.01); *H01L 21/67115* (2013.01); *G06T 2207/30148* (2013.01); *H01L 22/12* (2013.01)

(58) Field of Classification Search
CPC ......... H01L 21/67115; H01L 21/67248; H01L 21/324; H01L 21/268; H01L 22/12; G02B 21/0016; G02B 26/10; G06T 2207/10056; G06T 2207/30148; G06T 7/0004
USPC .................................... 438/14, 16; 427/8–10
See application file for complete search history.

(56) References Cited

U.S. PATENT DOCUMENTS

| | | | |
|---|---|---|---|
| 6,673,639 B2 * | 1/2004 | Wada ................ | H01L 29/78675 |
| | | | 438/14 |
| 10,083,843 B2 | 9/2018 | Hawryluk et al. | |
| 2005/0078298 A1 | 4/2005 | Takami | |
| 2007/0188744 A1 | 8/2007 | Leslie et al. | |
| 2012/0100640 A1 | 4/2012 | Anikitchev et al. | |
| 2016/0035603 A1 | 2/2016 | Ikenoue et al. | |
| 2017/0120337 A1 | 5/2017 | Kanko et al. | |

(Continued)

FOREIGN PATENT DOCUMENTS

| | | | |
|---|---|---|---|
| KR | 1020140067793 A | 6/2014 | |
| WO | WO 2021/007585 | * 1/2021 | ............. H01L 21/66 |

OTHER PUBLICATIONS

Farzaneh et al., "CCD-based thermoreflectance microscopy: principles and applications." J. Phys. D: Appl. Phys. 42 (2009) 143001 (20 pp).

(Continued)

*Primary Examiner* — Mary A Wilczewski
(74) *Attorney, Agent, or Firm* — Downs Rachlin Martin PLLC

(57) ABSTRACT

High bandwidth time-and-space resolved phase transition microscopy systems configured to detect melt onset in a wafer being processed by laser annealing systems with ultra-short dwell times and spot size.

26 Claims, 8 Drawing Sheets

(56) References Cited

U.S. PATENT DOCUMENTS

2021/0013070 A1* 1/2021 Reed .................... H01L 21/324

OTHER PUBLICATIONS

Wahl et al., "Application of sub-ns pulsed LEDs in fluorescence lifetime spectroscopy." Proc. SPIE 4648, Test and Measurement Applications of Optoelectronic Devices. Apr. 16, 2002.
Forster eg al., "Excimer Laser-Annealing of Amorphous Silicon Layers." Excerpt from the Proceedings of the 2011 COMSOL Conference in Stuttgart.

* cited by examiner

“MELT DETECTION SYSTEMS AND METHODS OF USING THE SAME”

RELATED APPLICATION DATA

This application claims the benefit of priority of U.S. Provisional Patent Application Ser. No. 62/871,877, filed on Jul. 9, 2019, and titled "Melt Detection Systems and Methods of Using the Same," which is incorporated by reference herein in its entirety.

FIELD OF THE INVENTION

The present disclosure relates generally to thermoreflectance microscopy, and in particular relates to high bandwidth time-and-space resolved phase transition microscopy.

BACKGROUND

Pulsed-laser melt annealing systems are utilized in advanced integrated circuit (IC) chip fabrication for rapid thermal processing of the chips. The heat treatments provided by such laser systems can be used for various effects, such as dopant activation, defining junctions, and otherwise changing material and electrical properties of the chip. Accurate measurement and control of wafer temperature during annealing with pulsed-laser systems, however, is important and can be challenging as the time duration over which the laser raises the wafer temperature to a melt temperature and the surface area of the wafer over which the laser acts decrease.

SUMMARY OF THE DISCLOSURE

In one implementation, the present disclosure is directed to a method of detecting the onset of melt in a region of interest of a semiconductor surface during a laser annealing process. The method includes irradiating the semiconductor surface with pulses of radiation; capturing, with a pixelated image sensor, an image that captures a portion of the radiation that has reflected off of the semiconductor surface; and processing the image to detect a new discontinuity in an intensity of the reflected radiation in the region of interest of the image, the new discontinuity indicating the onset of melt of the semiconductor in the region of interest.

In another implementation, the present disclosure is directed to a melt detection system. The melt detection system includes a probe configured to emit pulses of radiation incident onto a surface of a semiconductor wafer having a region of interest being heated by a fast scan annealing laser system; a pixelated image sensor configured to (i) capture a reflected portion of the incident radiation from the region of interest and (ii) generate a captured image of the reflected portion of the incident radiation; and a processor configured to process the captured image to detect an onset of melt in the region of interest of the surface.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Aspects of the present disclosure include high bandwidth time-and-space resolved phase transition microscopy systems configured to detect melt onset in a wafer being processed by laser annealing systems with ultra-short dwell times and spot size. In some examples, melt detection systems of the present disclosure are configured to accurately and reliably detect melt onset for lasers with ultra-short dwell times in the range from 10 ns to 500 ns or 25 ns to 250 ns and spot sizes in the range of 10 um-50 um×10 um-50 um.

Melt annealing typically includes locally raising the temperature of a wafer surface or subsurface until it melts. In an example wherein the wafer surface is constituted by a thin layer of silicon overlying a layer of material with a lower melt temperature (e.g., germanium or germanium-silicon), the wafer surface may remain solid while the subsurface material melts. Melt detection systems described herein may be configured to detect melt in a surface melt process, where melt occurs on the wafer surface and/or may be configured to detect melt in a subsurface melt process, where the wafer surface remains solid and a volume of material beneath the wafer surface melts.

Figure 1:
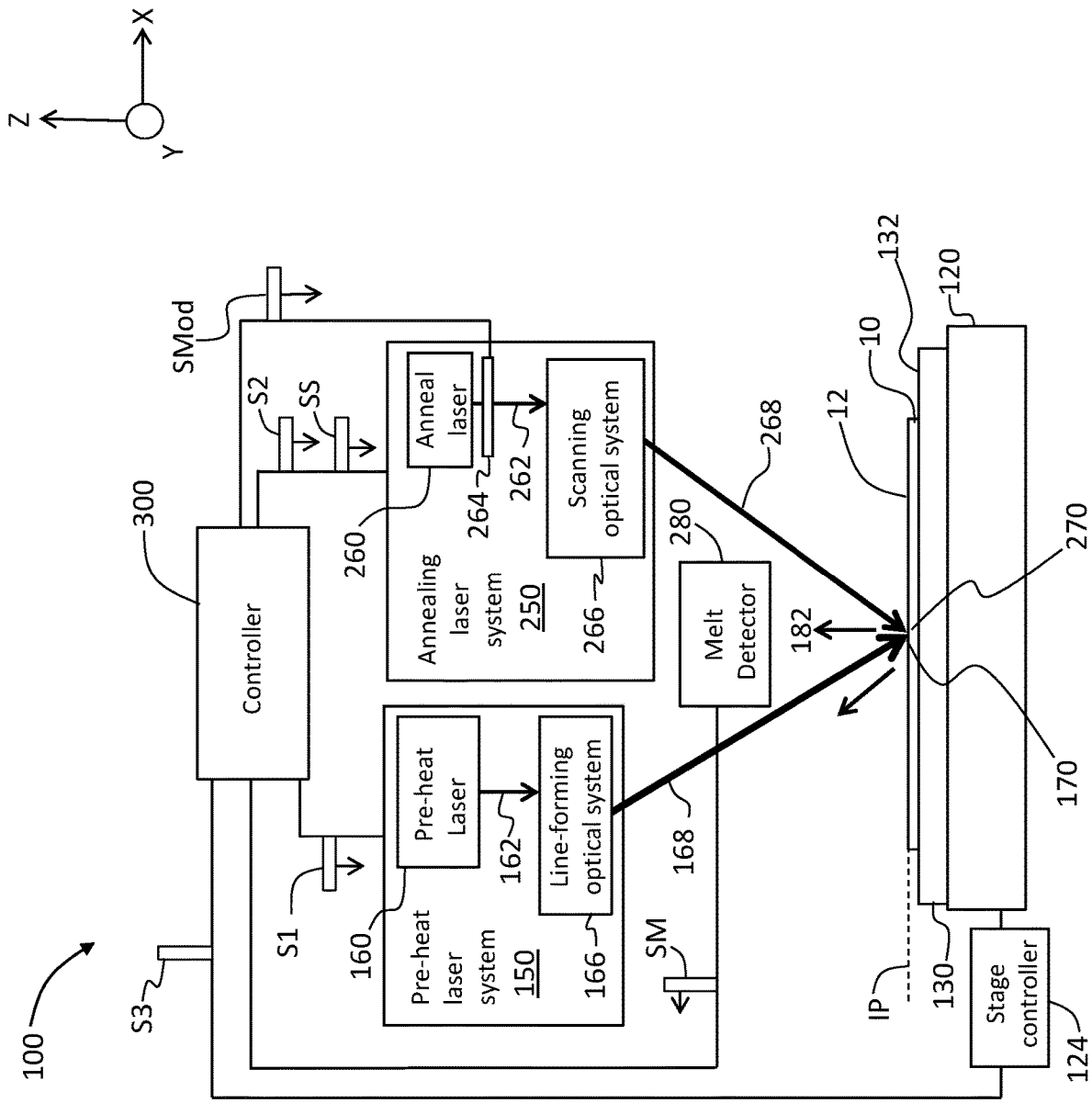
FIG. 1 is a schematic diagram of an example ultrafast laser annealing system with melt detection according to the disclosure.

FIG. 1 is a schematic diagram of an example quasi continuous wave (QCW) laser annealing system ("system") 100 that may incorporate melt detection systems of the present disclosure. As will be appreciated, system 100 is described and illustrated by way of example and melt detection systems of the present disclosure may be used on any of a variety of other applications, including other laser annealing systems. Certain aspects of example embodiments of system 100 are described in U.S. Pat. No. 10,083,843, titled, Laser Annealing Systems And Methods With Ultra-Short Dwell Times, and issued on Sep. 25, 2018, the contents of which are incorporated by reference herein in its entirety. The references incorporated in U.S. Pat. No. 10,083,843 are also incorporated by reference herein in their entireties, including, U.S. Pat. Nos. 8,309,474; 8,546,805; 8,865,603; and U.S. patent application Ser. No. 14/497,006, now issued as U.S. Pat. No. 9,343,307.

System 100 includes a wafer stage 120 that operably supports a chuck 130 having an upper surface 132. Wafer stage 120 is operably connected to a stage controller 124 and is configured to move in the X-Y plane and optionally in the Z-direction via the operation of the stage controller. Chuck upper surface 132 is configured to operably support a wafer 10 having a surface 12 that may include a pattern defined by semiconductor structures typically associated with the various stages of fabricating IC chips. In an example, chuck 130 is heated so that wafer 10 can be pre-heated. Wafer stage 120 is operably connected to stage controller 124.

In the illustrated example, system 100 also includes a pre-heat laser system 150 configured to generate a pre-heat laser beam 168. The pre-heat laser beam 168 is used to pre-heat wafer surface 12 by raising the either the wafer surface (or wafer subsurface) temperature $T_S$ to a pre-anneal temperature $T_{PA}$ that is less than the melt temperature $T_M$.

Pre-heat laser system 150 includes a pre-heat laser 160 and a line-forming optical system 166. The pre-heat laser 160 can include a diode laser, a fiber laser or a $CO_2$ laser, such as a continuous-wave (CW) p-polarized 10.6 micron $CO_2$ laser. In an example, line-forming optical system 166 is configured so that pre-heat laser beam 168 is incident wafer surface 12 at a near normal incident angle or at a large oblique incident angle. In an example embodiment, the angle of incidence of pre-heat laser beam 168 is substantially equal to the Brewster's angle for wafer surface 12, so that adverse pattern density effects from non-uniform optical absorptions are reduced or minimized.

The line-forming optical system 166 is configured to receive an initial laser beam 162 from pre-heat laser 160 and form therefrom a pre-heat line image 170 (FIGS. 2 and 3) on wafer surface 12.

System 100 also includes an annealing laser system 250 configured to generate a scanning laser beam 268 that forms an annealing image 270 on the wafer surface 12. The annealing laser system 250 includes an anneal laser 260 that emits an initial laser beam 262, a modulator 264 operably connected to a modulator driver, and a scanning optical system 266 that receives the initial laser beam and generates the scanning laser beam 268. In an example, modulator 264 is an acousto-optical modulator (AOM) that is used to selectively and alternately block and pass the initial laser beam 262 to control the scanning of annealing image 270.

The line-forming optical system 166 and scanning optical system 266 can each include lenses, mirrors, apertures, filters, active optical elements (e.g., variable attenuators, etc.) and combinations thereof. In an example, one or both of line-forming optical system 166 and scanning optical system 266 can be configured to perform beam conditioning, e.g., uniformize their respective laser beams 162 and 262 and/or provide the laser beams with a select cross-sectional shape. Example optical systems suitable for performing such beam conditioning are disclosed in U.S. Pat. Nos. 7,514,305, 7,494,942, 7,399,945 and 6,366,308 the contents of which are incorporated by reference herein in their entireties. In an example, the initial laser beam 262 from anneal laser 260 has high quality (e.g., is substantially Gaussian) and is used without substantial (and in some cases, without any) beam conditioning.

System 100 also includes a melt detection system 280 that, as described more below, is configured to introduce a pulsed radiation source at a region of interest of wafer surface 12 and capture a reflected portion of the incident light with a sensor for temporally and spatially resolving an intensity of the reflected light to detect the onset of melt.

In an example embodiment, laser annealing system 100 further includes a controller 300. In an example embodiment, controller 300 is or includes a computer, such as a personal computer or workstation. Controller 300 preferably includes any of a number of commercially available microprocessors, a suitable bus architecture to connect the processor to a memory device, such as a hard disk drive, and suitable input and output devices (e.g., a keyboard and a display, respectively). Controller 300 can be programmed via instructions (software) embodied in a non-transitory computer-readable medium (e.g., memory, processor or both) that cause the controller to carry out the various functions of system 100 to effectuate annealing of wafer 10.

Controller 300 is operably connected to pre-heat laser system 150 and scanning laser system 250 and controls the operation of these systems. Controller 300 is electrically connected to modulator 264 and controls the operation of the modulator with a control signal SMod. In an example, controller 300 includes digital signal processors (DSPs) (not shown) to control scanning functions in the pre-heat and scanning laser systems 150 and 250. Controller 300 is also operably connected to melt detection system 280 and scanning optical system 266 and is configured to receive and process melt signal SM as described below and control the melt detection signal via a fourth set of digital control signals S4, such as to control probe 602 and sensor 624, such as probe and sensor exposures and integration times.

In an example of the operation of system 100, system controller 300 sends a first control signal S1 to pre-heat laser 160, which in response thereto generates initial laser beam 162. This initial laser beam 162 is received by optical system 166, which forms therefrom pre-heat laser beam 168, which forms pre-heat line image 170 at wafer surface 12.

System controller 300 also sends as second control signals S2 to anneal laser 260, which in response thereto generates initial laser beam 262. This initial laser beam 262 is received by scanning optical system 266, which is controlled by a control signal SS to form scanning laser beam 268, which in turn forms annealing image 270 at wafer surface 12.

System controller 300 also sends a third control signals S3 to stage controller 124 to cause the controlled movement of stage 120 to move (scan) wafer 10 relative to the pre-heat line image 170 and annealing image 270. In an example where chuck 130 provides wafer pre-heating, system controller 300 may also send another control signal (not shown) to a chuck controller to initiate the wafer pre-heating process. Typical chuck pre-heating ranges are from room temperature (25° C.) to 400° C.

In an example, system controller 300 also receives melt signal SM from melt detection system 280 and uses SM to control the intensity of one or both of pre-heat laser beam 168 and scanning laser beam 268.

Figure 2:
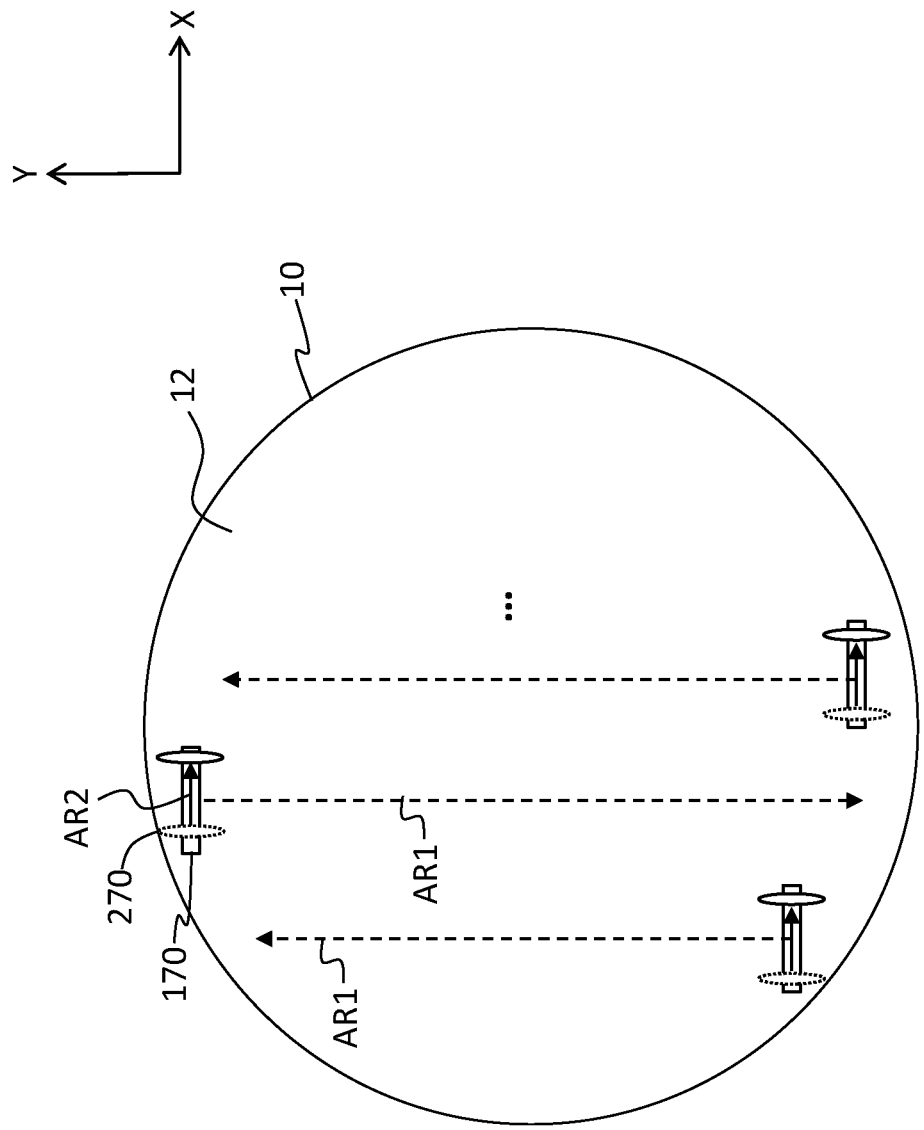
FIG. 2 is a top-down view of the wafer illustrating an example method of scanning of the wafer surface with the pre-heat line image and the annealing image.

FIG. 2 is a top-down view of wafer 10 illustrating an example method of scanning of the wafer surface with the pre-heat line image 170 and annealing image 270. Pre-heat line image 170 moves relative to wafer surface 12 in the y-direction, as indicated by arrow AR1, also referred to herein as the pre-heat scan direction. The portion of wafer surface 12 associated with pre-heat line image 170 represents a locally pre-heated portion of the wafer surface wherein the wafer surface temperature $T_S$ is raised to the pre-anneal temperature $T_{PA}$. Annealing image 270 moves relative to wafer surface 12 in the x-direction, as indicated by arrow AR2, also referred to herein as the annealing scan direction.

The scanning optical system 266 is configured to scan or sweep annealing image 270 in the x-direction over pre-heat line image 170 across the length of the pre-heat line image. In one example, the scanning speed of annealing image 270 is sufficiently rapid as compared to the movement of the pre-heat line image 170 that the pre-heat line image is essentially stationary during the scanning of the annealing image.

Once annealing image 270 reaches the end of pre-heat line image 170, the scanning beam 268 and corresponding annealing image 270 are turned off by activating modulator 264 (FIG. 1) so that it blocks the transmission of initial laser beam 262. While the scanning beam 168 is "off," the pre-heat line image 170 is allowed to move in the y-direction so that the next portion of wafer surface 12 can be scanned. In an example, the movement of pre-heat line image 170 may be continuous, e.g., by continuously moving stage 120. Once the pre-heat line image 170 is in place, the scanning beam 168 is turned back on by placing the modulator 264 in the transmission mode when the scanning optical system 166 can direct the scanning laser beam 268 and the corresponding annealing image 270 to a start position at a first end of a newly located pre-heat line image 170. Then the scanning of annealing image 270 over the newly located pre-heat line image 170 is carried out. FIG. 2 illustrates an example method of scanning substantially the entire wafer surface 12 (e.g., at least the patterned portions) by repeating the above-described scanning method.

Figure 3:
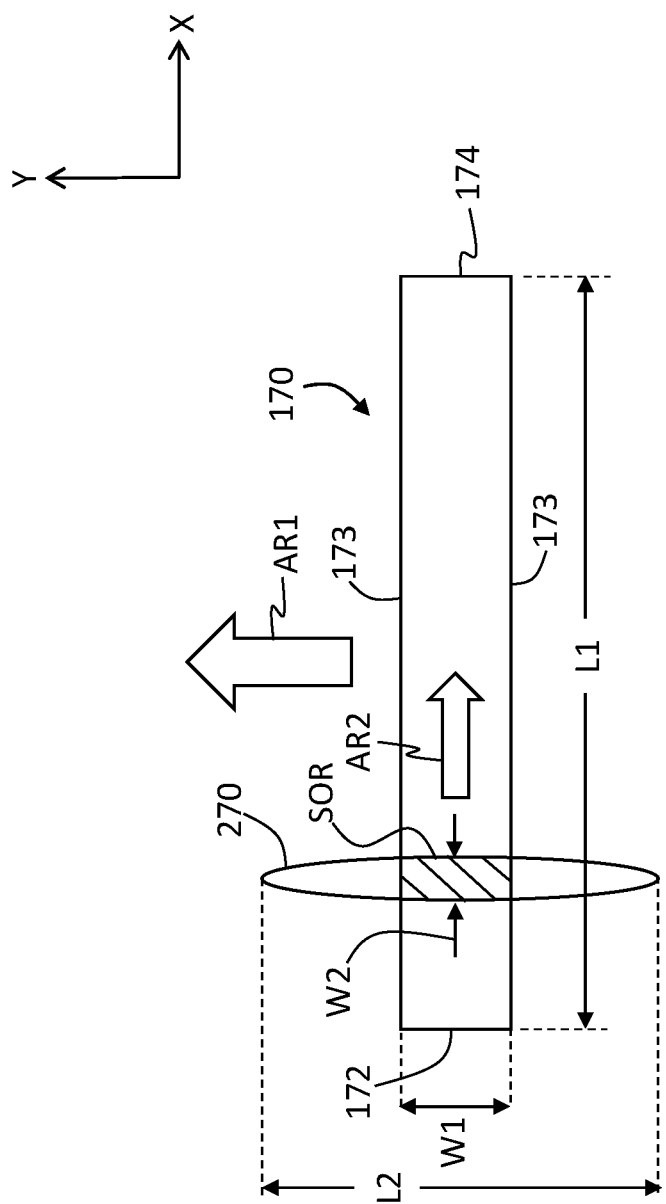
FIG. 3 is a top-down close-up view of the pre-heat line image and the annealing image formed on the wafer surface showing the relative dimensions and scan directions of the two images, and the scanning overlap region that defines the dwell time of the melt annealing process.

FIG. 3 is a top-down close-up view of one of pre-heat line images 170 and annealing images 270 formed on the wafer surface 12. The pre-heat line image 170 has a proximal end 172, a distal end 174, and opposite sides 173. The pre-heat line image 170 has a long direction (dimension) that runs from the proximal end 172 to distal end 174 and has a length L1. The pre-heat line image 170 also has narrow direction (dimension) measured between opposite sides 173 with a width W1. In an example, the length L1 is in the range from 5 mm to 20 mm, with an exemplary length L1 being in the range from 7 mm to 12 mm. Also in an example, width W1 is in the range from 50 μm to 200 μm, with an exemplary width W1 being 150 μm. In an example embodiment, pre-heat laser beam 168 (FIG. 1) has a Gaussian intensity profile in a scanning direction (e.g., the y-direction), and a relatively flat top profile in the long (cross-scanning) direction (e.g., the x-direction). The beam width W1 can be defined at the $1/e^2$ intensity value of the Gaussian profile or at the full-width half-maximum (FWHM) of the Gaussian profile.

The anneal image 270 overlaps a portion of pre-heat line image 170, and the region of overlap is referred to herein as the "scanning overlap region" SOR. The annealing image 270 has a long dimension with a length L2 and a narrow dimension with a width W2. In the illustrated example, the annealing image 270 has a substantially Gaussian intensity distribution in the x-direction and in the y-direction. The long dimension L2 of annealing image 270 is oriented in the direction of the short dimension W1 of pre-heat line image 170. In an example, the length L2 is in the range from 100 μm to 500 μm, while the width is in the range from 10 μm to 50 μm, and in some examples, the width is in the range from 15 μm to 20 μm or in the range from 16 μm to 18 μm. The scan direction AR2 of annealing image 270 perpendicular (orthogonal) to its long direction. The scan direction AR2 is also referred to as the annealing scan direction and is substantially orthogonal to pre-heat scan direction AR1. The width W2 of annealing image 270 defines the width of the scanning overlap region SOR in the annealing scan direction AR2.

In an example, length L2 is substantially greater than width W1 (e.g., between 2× and 4× larger) so that the ends of the annealing image 270 extend beyond the sides 173 of the pre-heat line image 170, as shown in FIG. 3. This makes it relatively easy to align the pre-heat line image 170 and the annealing image 270 to define the scanning overlap region SOR. This configuration utilizes the central, high-intensity portion of the annealing image 270 to add to the localized pre-heating of the wafer surface provided by the pre-heat line image 170 to bring the wafer surface temperature $T_S$ up to the melt temperature $T_M$.

In one example, the dwell time $\tau_D$ of the scanning overlap region SOR is in the range 10 ns≤$\tau_D$≤500 ns, while in another example is in the range 25 ns≤$\tau_D$≤250 ns. For a width W2=15 μm and a dwell time of 25 ns, the scanning speed of annealing image 170 and thus the scanning overlap region SOR is $v_S$=W2/$\tau_D$=600 m/s. For a dwell time $\tau_D$ of 250 ns, the scanning speed is $v_S$=60 m/s. For a dwell time $\tau_D$ of 500 ns, the scanning speed is $v_S$=30 m/s. For a dwell time $\tau_D$ of 10 ns, the scanning speed is 1500 m/s. In one example, scanning optical system 266 is configured to provide these speeds.

As noted above, in an example, anneal laser 260 is operated in the QCW regime. An example frequency of operation for anneal laser 260 is f=100 MHz or greater, or f=150 MHz or greater. A frequency f=150 MHz results in anneal laser 260 generating 150×$10^6$ light pulses per second. For a scan speed $v_S$=150 m/s of scanning beam 168, this translates into a pulse per distance rate $R_p$=f/$v_S$=1 pulse (p) for every micron of distance that the anneal image 270 travels, i.e., 1 p/μm. The dwell time $\tau_D$ is the amount of time it takes for width W2 of annealing image and scanning overlap region SOL to pass over a given point on the wafer 12. Thus, for an annealing image 270 that has a width W2=15 μm and that moves over a given point on the wafer surface 12 at $v_S$=150 m/s, that point will experience a number of pulses Np=$R_p$·W2=(1 p/μm)·(15 μm)=15 pulses. For a scan speed of 600 m/s and a width W2=20 μm, the pulse rate per distance Rp=f/$v_S$=0.5 p/μm, so that the number of pulses $N_P$=$R_P$·W2=(0.5 p/μm)·(20 μm)=10 pulses.

During the scanning process, melt detection system 280 can be used to monitor the thermal reflection radiation 182 from the scanning overlap region SOR. The melt detection system 280 generates melt signal SM representative of the detected thermal reflection and sends this signal to controller 300. Controller 300 receives the thermal melt signal SM and uses this signal to create a feed-back loop that controls the amount of power generated by at least one of the pre-heat and annealing laser systems 150 and 250 to control the laser power in at least one of the pre-heat laser beam 168 and the scanning laser beam 268 so that the wafer surface temperature $T_S$ can be controlled.

Figure 4:
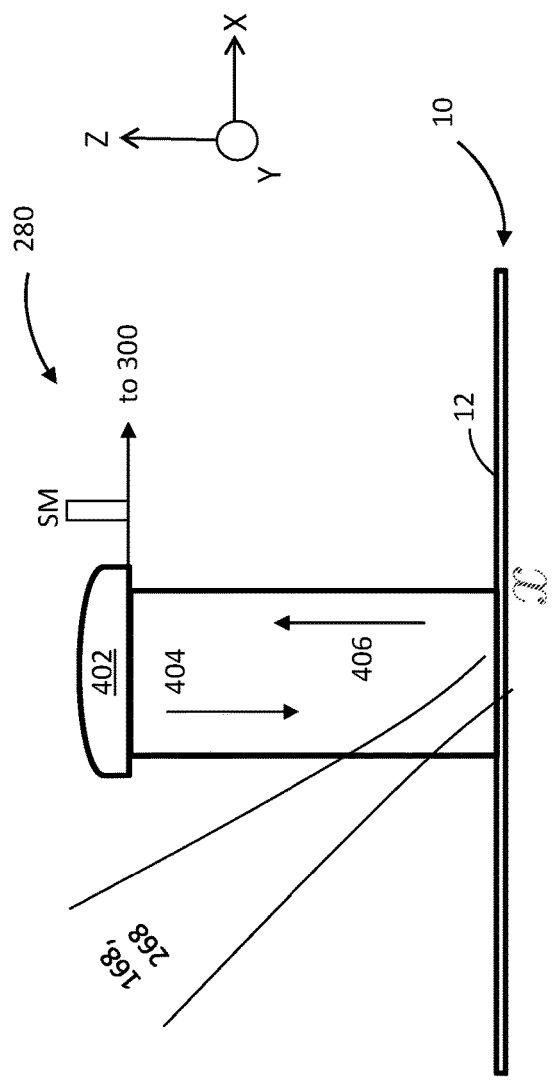
FIG. 4 is a schematic diagram of an example melt detection system.
Figure 5:
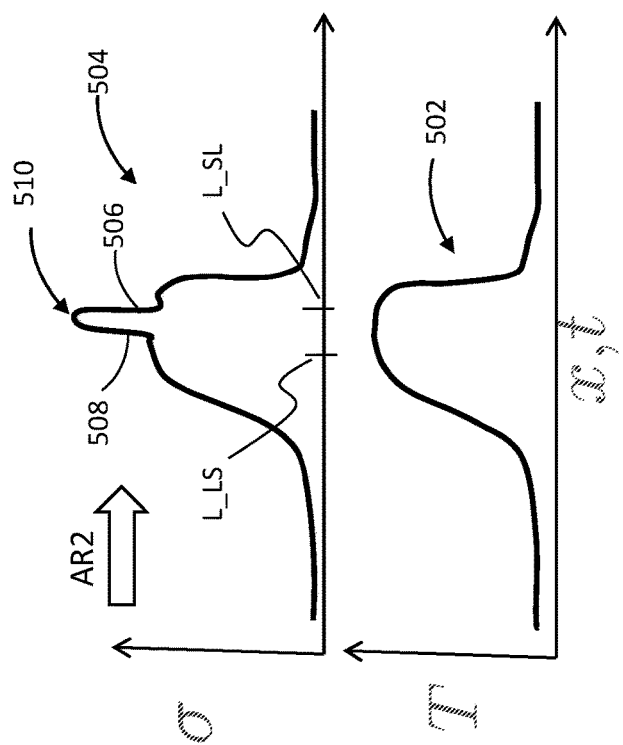
FIG. 5 conceptually illustrate the relationship between reflectivity and temperature and the occurrence of a discontinuity in reflectivity when the material begins to melt.

FIGS. 4 and 5 illustrate aspects of melt detection system 280, with FIG. 4 showing a pulsed probe and camera 402 configured to emit pulses of radiation, e.g. light, 404 incident on wafer surface 12 and capture a reflected portion 406 of the incident light 404 that is reflected from the wafer surface. Melt detection system 280 is configured to detect transient changes in the reflectivity of the wafer 10 by measuring an intensity of reflected light 406 as wafer 10 is heated, for example, by an annealing laser, such as laser beams 168 and 268. FIG. 5 conceptually illustrates how a reflectivity, σ, of wafer surface 12 varies as a function of temperature and material phase of the wafer 10. The lower plot shows a temperature profile 502 of a local region of the wafer surface 12 at a given point in time, illustrated as surface temperature, T as a function of position, x. The upper plot shows a corresponding reflectivity profile 504 of the local region of the wafer surface, and shows the reflectivity, σ, of the wafer surface changes with temperature, T. FIG. 5 also shows a first discontinuity 506 in reflectivity profile 504 at a disordered solid to liquid phase transition location, L_SL, on the wafer surface 12 where a phase change in the wafer material has occurred, and a second discontinuity 508 at a liquid to ordered solid phase transition location, L_LS, where the melted wafer material begins to cool and solidify as an ordered single crystal material structure. Discontinuities 506 and 508 in reflectivity are caused by the phase change of the wafer material as the local temperature reaches a melt temperature and the material begins to transition from a disordered solid to a liquid phase and then reaches a solidification temperature during cooling, both discontinuities being a sharp or substantially discontinuous change the reflectivity of the material.

As described above in connection with FIGS. 2 and 3, anneal image 270 overlaps a portion of pre-heat line image 170 forming a small scanning overlap region SOR that moves at high velocity in the scan direction, AR2, of the anneal image. Controller 300 is configured to control preheat and annealing laser beams 168 and 268 so that they melt the portion of the wafer 10 exposed to the SOR of the two beams. The portion of wafer 10 extending between discontinuities 506 and 508 in reflectivity is a melted region 510 of the wafer that is exposed to the SOR of beams 168, 268, the melted region 510 moving at a velocity across the wafer 10 that corresponds to a velocity of the annealing image 270 (FIG. 3). In the example shown in FIG. 5, the portions of the wafer 10 to the right of melted region 510 have not yet been melted and may be a disordered solid that may contain discontinuities and irregularities in the material structure, such as crystal discontinuities and un-activated dopants. In melted region 510, the wafer material has transitioned to a liquid phase, significantly increasing the mobility of the atoms in the wafer material, allowing them to reorder. As the SOR moves away from a melted area of the wafer, the wafer material begins to cool, allowing the atoms in the wafer material in the portion of wafer 10 to the left of melted region 510 to arrange themselves into an ordered solid, indicated by discontinuity 508, that approaches their single crystalline ground state. Thus, discontinuity 506 is associated with a disordered solid-liquid phase transition, and discontinuity 508 is associated with a liquid-ordered solid phase transition. As discussed more below, melt detection system 280 and controller 300 may be configured to detect both the onset of melting of the wafer as well as the subsequent solidification of the wafer, in some examples, substantially immediately, and use the detection of melt and re-solidification in a closed loop feedback control of preheat laser system 105 and/or annealing laser system 250. Thus, melt detection system is designed and configured to measure a thermodynamically irreversible pair of phase transitions through the observation of the moving boundary of the liquid phase, e.g., discontinuity 506 and/or 508. For example, melt detection system 280 may be configured to determine a duration of time that the wafer material is in the liquid phase and controller 300 may be configured to adjust preheat laser system 105 and/or annealing laser system 250 for a target melt phase time duration. For example, there may exist a minimum melt phase time duration to allow the discontinuities in the wafer material to be removed and the atoms of the material to transition from a disordered to an ordered configuration. A target melt phase duration may be equal to or slightly greater than the minimum melt phase time duration so that the target material structure modifications occur while minimizing to the extent possible additional unnecessary heating of the wafer material.

Figure 6A:
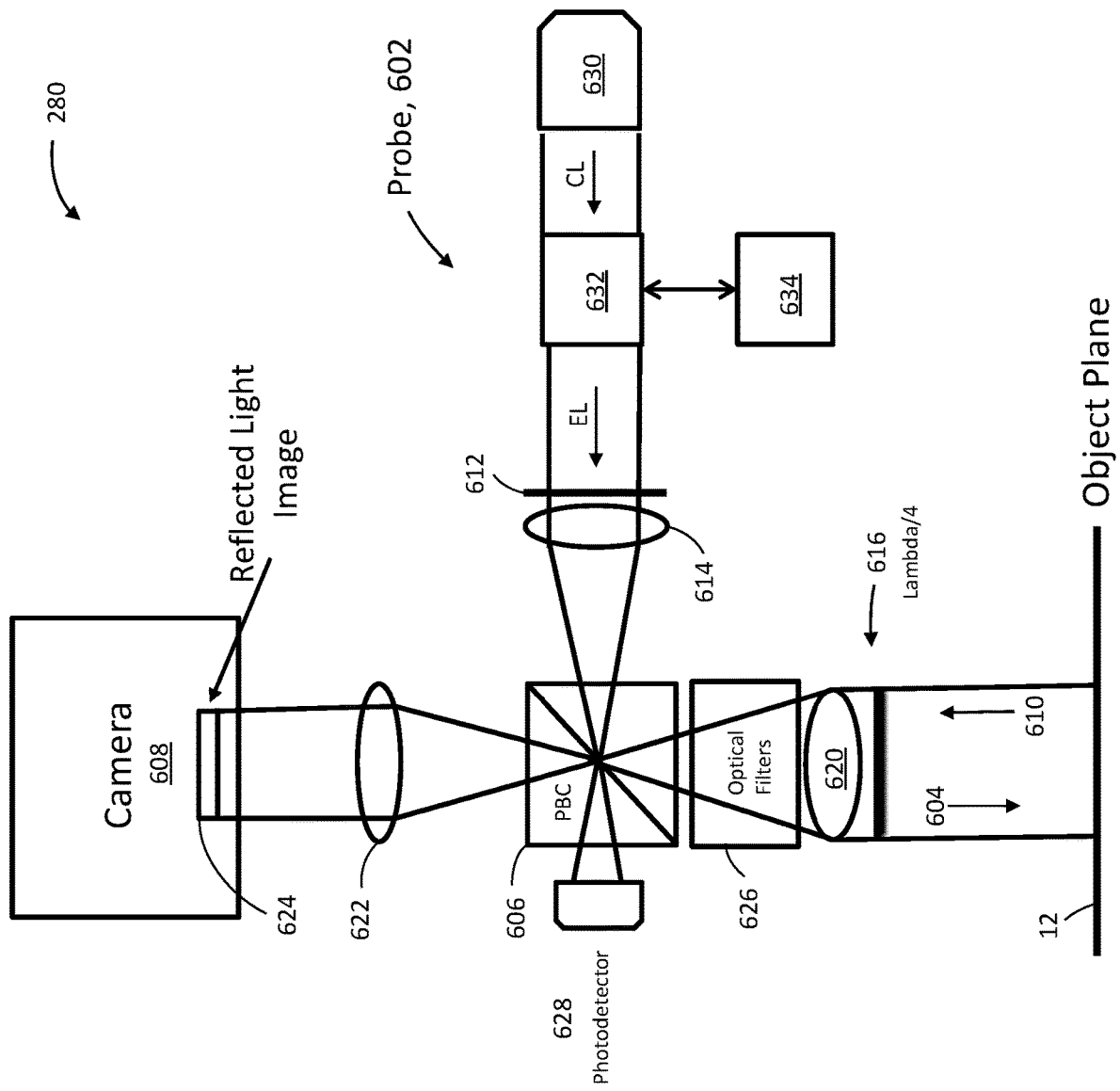
FIG. 6A is a schematic diagram of an example melt detection system.

FIG. 6A illustrates components of one example of melt detection system 280. Melt detection system 280 is configured to expose a region of interest (ROI), such as a ROI containing a scanning overlap region (SOR) (FIG. 3), to light emitted from a pulsed probe 602 and to image the illuminated wafer surface 12 onto an image sensor 624 of a camera 608. Melt detection system 280 may utilize light of known or unknown polarization that is normal or at an angle to wafer surface 12. As described below, in the illustrated example, melt detection system 280 exposes wafer surface 12 to circularly polarized light normal to the wafer surface 12.

Probe 602 may be configured to emit pulsed light 604 that is incident on wafer surface 12 via a polarizing beamsplitter cube (PBC) 606 and system 280 may include a camera 608 configured to capture a reflected portion 610 of light 604 that has reflected off of wafer surface 12. In some examples, probe 602 may be a diode, or an optical fiber connected to a laser source. In one example, probe 602 is a laser light source configured to emit blue light, which has a relatively short penetration depth in Si, and other semiconducting materials. The short penetration depth results in measurement of a thinner layer of semiconductor than green light, red light, or very-near IR. In other examples, probe 602 may emit other wavelengths of light, including one or more of green or red light. In one example, probe emits 450 nm light. Blue light also monotonically changes reflectivity as a function of temperature when Si is in the solid phase, which facilitates extracting the entire temperature processing history of a spot on a wafer. One commercially available example of a pulsed laser source that may be used in some embodiments is the Nanosecond Pulsed Laser Diode System available from Thorlabs®, part number NPL45C. In other examples, probe 602 may be configured to emit light in a telecom band, e.g., between 1260 nm and 1675 nm. For example, a melt layer of SiGe, which has a lower melt temperature than Si, may be submerged in Si. In the solid phase, both Si and SiGe are transparent to 1550 nm wavelength light, and so melt detection can be effected when the submerged layer melts and shows a large reflectivity shift.

In one example, probe 602 includes a pulsed laser 630 that emits a coherent light, CL, which is transmitted via an optical fiber 632. In one example, optical fiber 632 is a multi-mode optical fiber, which disorders the phase and amplitude profile of the coherent light, CL, that propagates through it. The light, EL, emitted by the multi-mode optical fiber 632 may contain unwanted optical speckle. In one example, a mechanical oscillator 634 is operably coupled to fiber 632 and is configured to shake the fiber to thereby cause the phase profile of the optical speckle in emitted light, EL, to vary quickly in time, resulting in a time-averaged flat probe field, which improves the quality of the image captured by camera 608. As described more below, probe 602 may be controlled to emit pulses of light at a frequency that is synchronized with a frequency of an annealing laser source for rapid detection of the onset of melt.

The illustrated melt detection system 280 also includes a plate 612 and lens 614, which are configured to put probe 602 in the conjugate plane to the image, which makes the field of light 604 collimated when it reaches wafer surface 12 and when reflected light 610 reaches camera 608. PBC 606 and a quarter wave retarder plate 616 create two beam-paths for probe 602. When the beam has passed twice through quarter wave retarder plate 616, it then passes directly through PBC 606 to camera 608. Quarter wave retarder plate 616 may be configured for radiation at the wavelength of radiation emitted by probe 602, for example, 450 nm. Objective lens 620 and image forming lens 622 re-image the image plane on sensor 624. In one example, the objective and image forming lens are configured to have a sufficient optical resolution to capture localized onset of melt. For example, the objective and image forming lens are configured to optically resolve the SOR, for example, approximately a 10 μm×10 μm area. In one example, the objective and image forming lens comprise a diffraction-limited 0.1 numerical aperture (NA) imaging system configured to optically resolve 3 micrometer-wide spots, which may be used to resolve larger melt areas, e.g., a 10 μm×20 μm area of melted wafer surface 12. In one example, at the onset of melt, a melt area spot may be brighter than nearest-neighbor optically-resolvable spots, for example a brightness may exceed a threshold, T. In some examples, T may be in the range of 10% to 40% greater than nearest-neighbor optically-resolvable spots and in some examples, 15% to 35% or 20% to 30% or approximately 25%. In one example, a magnification of objective lens 620 and image forming lens 622 may be matched to a pixel pitch of image sensor 624 to project each optically resolvable spot onto a n×n pixel square, e.g., a 2×2 or 4×4, etc., pixel square. Matching magnification to pixel pitch, while oversampling the optical resolution, eliminates aliasing, and can be used to effectively increase the well-depth of a digitally-shiftable pseudo-pixel, increasing SNR. Photon absorption is a Poissonian process, so SNR~1/sqrt(N). In addition, there a myriad benefits to oversampling in both fitting and fourier-space-based algorithms that allow sub-pixel resolvability of the center-of-mass of an object, along with other physical observables.

In one example, objective lens 620 and image forming lens 622 have a field of view (FOV) that is significantly larger than an area of SOR, for example, hundreds of times larger than SOR, for example, a FOV in the range of ¼ in² to 1 in² and in some examples, approximately ½ in². In some examples, probe 602 and downstream optical components of system 280 are configured to illuminate an area of wafer surface 12 that is smaller than the FOV of objective lens 620 and image forming lens 622, and in some examples, illuminates an area having a width that is approximately equal to or greater than the length, L1, of preheat line image 170, for example, in the range from 5 mm to 20 mm.

Optical filters 626 filter out light other than reflected light 610, such as light from scanning laser beams 168 and 268 scattered by features on wafer surface 12. Light from probe 602 that is reflected from optical filters 626 or surfaces of objective lens 620, or quarter-wave plate 616, are transmitted by PBC 606 back to probe 602. In some examples, a photodetector 628 can be used to normalize light emitted by probe 602 during image analysis, which can be useful if the probe light source is unstable. In the illustrated example, camera 608 is a visible light camera with a pixelated CCD or CMOS sensor 624.

Figure 6B:
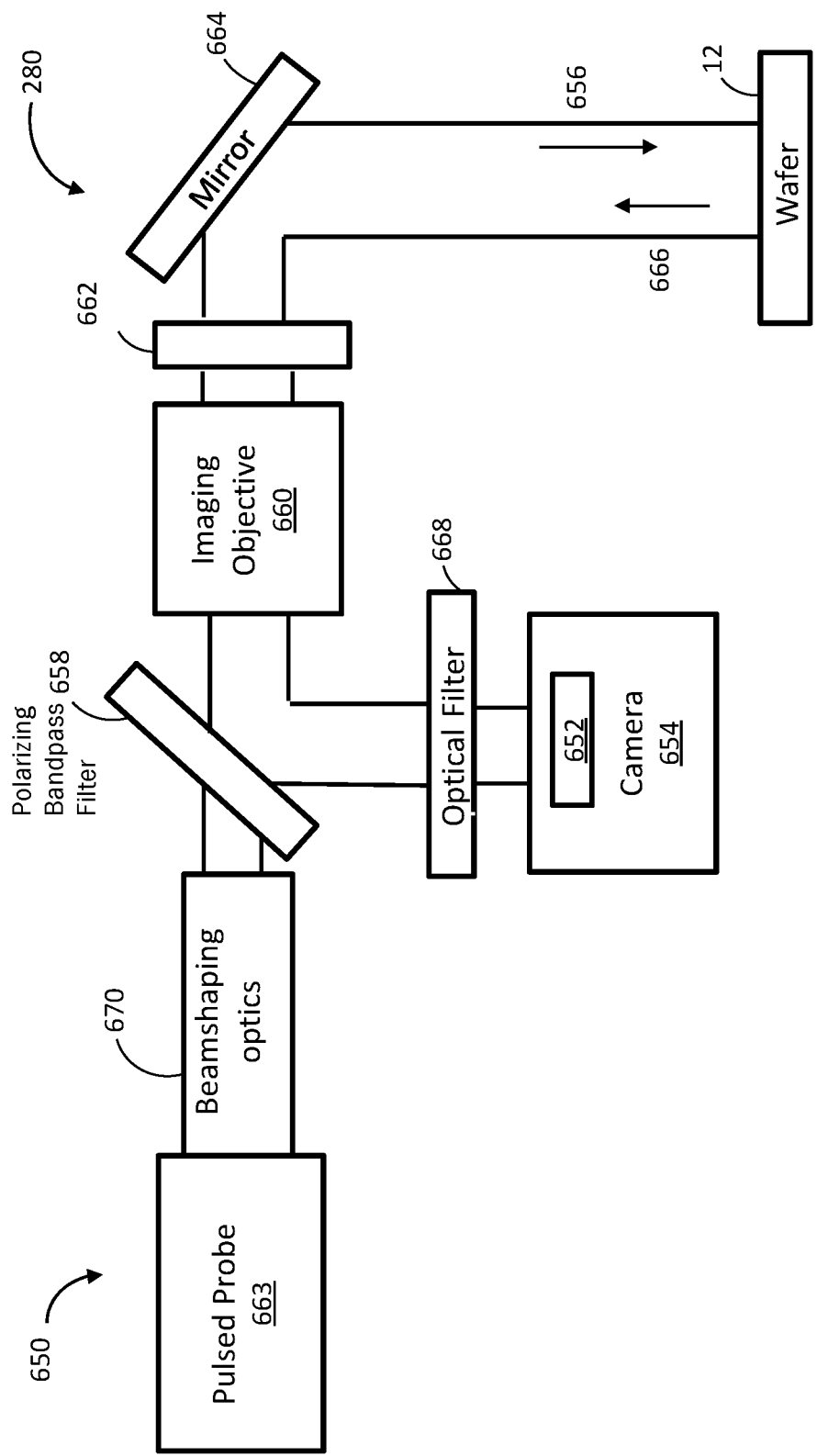
FIG. 6B is a schematic diagram of another example melt detection system.

FIG. 6B illustrates components of another example of melt detection system 280. In the illustrated example, melt detection system 280 is configured to expose a region of interest (ROI), such as a ROI containing a scanning overlap region (SOR) (FIG. 3), to light emitted from a pulsed probe 650 and to image the illuminated wafer surface 12 onto an image sensor 652 of a camera 654. In the illustrated example, camera 654 is a visible light camera with a pixelated CCD or CMOS sensor 652. Melt detection system 280 may utilize light of known or unknown polarization that is normal or at an angle to wafer surface 12. In example illustrated in FIG. 6B, melt detection system 280 exposes wafer surface 12 to circularly polarized light normal to the wafer surface 12.

Probe 650 may be configured to emit pulsed light 656 that is incident on wafer surface 12 via a polarizing bandpass filter 658 which acts as a polarizing splitter for the light emitted by probe 650, for example p or s-polarized light, and as a non-polarizing mirror for other incident visible and near infrared radiation. The polarized light passes through an objective lens 660, a quarter wave retarder plate 662, and a mirror 664. In one example, objective lens 660 is a super-apochromat which has a low level of chromatic aberration and field of view (FOV) defocus effects as compared to a singlet objective configuration such as the example illustrated in FIG. 6A. By way of non-limiting example, a commercially available objective lens which may be used for objective lens 660 is the Componon-S 5.6/150 available from Schnieder Kreuznach®. In one example, flat-field imaging of objective lens 660 reduces the amount of required post-processing of images captured by camera 654, such as model-based deconvolution, to extract information from the full FOV. The low chromatic aberration associated with objective lens 660 also enables the ability to measure thermal emission radiation from wafer surface 12 with the same imaging system to provide a second form of temperature measurement. Thermal emission radiation measurements may be made through the use of a color camera sensor 652 for simultaneous narrow-band 450 nm thermoreflectance and broadband 550-900 nm blackbody/photoluminescence thermal emission images, or independently, with a monochromatic camera 654 through the use of a 450 nm band-pass filter with a flipper mirror (not illustrated).

Camera 654 captures a reflected portion 666 of light 656 that has reflected off of wafer surface 12. In some examples, probe 650 may be a diode, or an optical fiber connected to a laser source. In one example, probe 650 is a laser light source configured to emit blue light and in one example emits 450 nm light. One commercially available example of a pulsed laser source that may be used in some embodiments is the Nanosecond Pulsed Laser Diode System available from Thorlabs®, part number NPL45C. In other examples, probe 602 may be configured to emit other colors of light or light in a telecom band, e.g., between 1260 nm and 1675 nm. In the illustrated example, probe 650 includes a pulsed laser 663 that emits a coherent light that is shaped via beam shaping optics 670. In one example, beam shaping optics 670 include a spherical and pair of cylindrical lenses and are configured to produce a collimated probe beam in the object-space in conjunction with imaging objective lens 660.

Objective lens 660 re-images the image plane on sensor 652. In one example, the objective lens is configured to have a sufficient optical resolution to capture localized onset of melt. For example, objective lens 660 is configured to optically resolve the SOR, for example, approximately a 10 μm×10 μm area. In one example, the objective lens 660 comprise a diffraction-limited 0.1 numerical aperture (NA) imaging system configured to optically resolve 3 micrometer-wide spots, which may be used to resolve larger melt areas, e.g., a 10 μm×20 μm area of melted wafer surface 12. In one example, a magnification of objective lens 660 may be matched to a pixel pitch of image sensor 652 to project each optically resolvable spot onto a n×n pixel square, e.g., a 2×2 or 4×4, etc., pixel square. In one example, objective lens 660 has a field of view (FOV) that is significantly larger than an area of SOR, for example, hundreds of times larger than SOR, for example, a FOV in the range of ¼ in² to 1 in² and in some examples, approximately ½ in². In some examples, probe 650 and downstream optical components of system 280 are configured to illuminate an area of wafer surface 12 that is smaller than the FOV of objective lens 660, and in some examples, illuminates an area having a width that is approximately equal to or greater than the length, L1, of preheat line image 170, for example, in the range from 5 mm to 20 mm. Optical filter 668 filters out light other than reflected light 666, such as light from scanning laser beams 168 and 268 scattered by features on wafer surface 12.

In the example illustrated in FIG. 6B, the entire imaging beam-path (probe & other) is reflected via mirror 664, and the shaped probe radiation is injected through transmission through polarizing bandpass filter 658, which eliminates spherical aberration introduced by the transmissive imaging path through the beam-cube in the example illustrated in FIG. 6A. In addition, the radiation emitted by laser probe 650 is shaped directly from the beam shaping optics 670 of the laser rather than from a multimode fiber, which eliminates the need for a mechanical shaker and is more efficient with the optical flux from a given pulse of radiation. Such a configuration also requires less post-processing due to the elimination of optical speckle caused by a fiber.

In other embodiments, any of a variety of alternate combinations and arrangements of lenses, mirrors, apertures, and filters from the arrangement illustrated in FIGS. 6A or 6B may be used that are configured to introduce a pulsed radiation source, such as a pulsed light source at a ROI of wafer surface 12 and capture a reflected portion of the incident light with a sensor for temporally and spatially resolving an intensity of the reflected light to detect the onset of melt.

Controller

Figure 7:
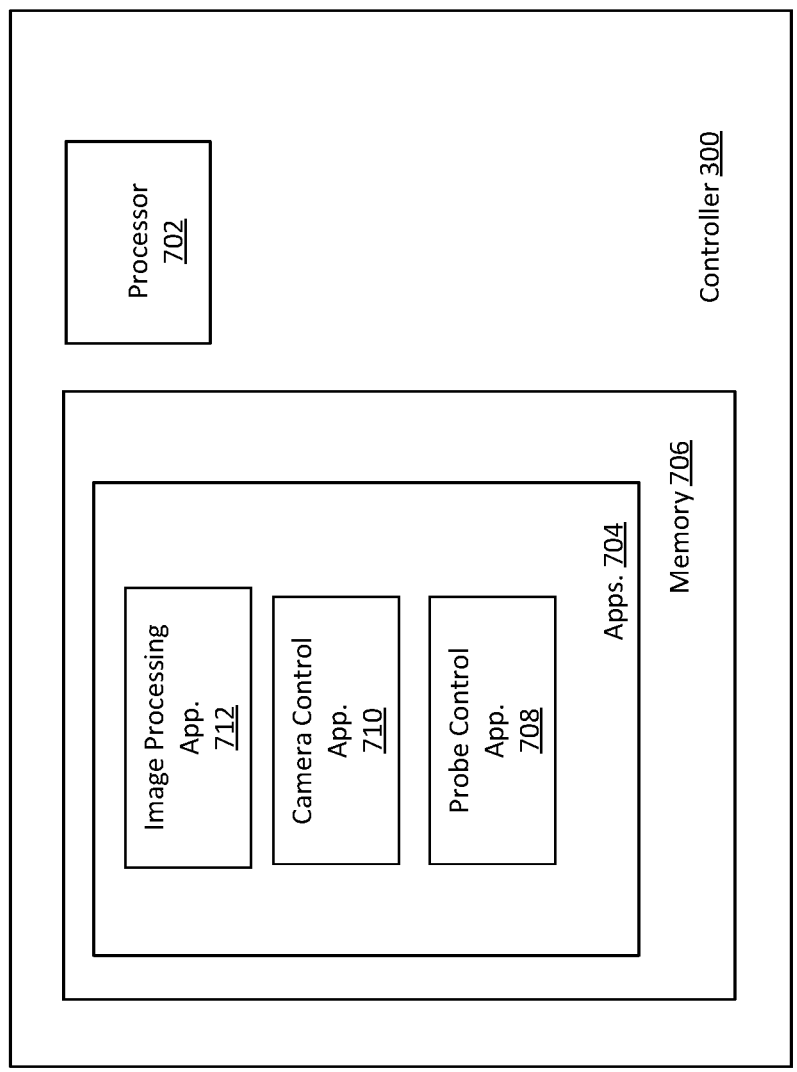
FIG. 7 is a functional block diagram of an example controller.

FIG. 7 is an example functional block diagram of certain components and functionality of controller 300. As will be appreciated, FIG. 7 and the accompanying description address a limited subset of the components and functions of controller 300. In the illustrated example, controller 300 includes a processor 702 configured to execute one or more applications 704 stored in memory 706. In the illustrated example, applications 704 include a probe controller application 708 configured to control an intensity, phase and/or frequency of pulsed radiation emitted by probe 602 and/or a pulse timing of radiation emitted by the probe. As noted above, scanning optical system 266 is configured to repeatedly scan or sweep annealing image 270 in the x-direction over pre-heat line image 170 across the length of the pre-heat line image at a sweep frequency, $f_{sweep}$. In one example, the sweep frequency, $f_{sweep}$, is in the range of 20 kHz to 100 kHz, and in some examples, 40 kHz to 80 kHz and in some examples, 50 kHz to 70 kHz.

Probe controller application 708 may include instructions for synchronizing the probe with sweep frequency, $f_{sweep}$, through a common clock, and determining a pulse frequency, $f_{Probe}$, and pulse phase $\phi_{probe}$ for probe for probe 602 as a function of the sweep frequency, sweep phase, and the aspect of the wafer material phase transition process to be measured. In one example, $f_{Probe} \ll f_{sweep}$ so that $n_{probes}$, per camera exposure is 1, so that melt, its width, and the phase transition's boundary can be confirmed individually for sets of single spots. In one example, a frequency ratio, $R = f_{sweep}/f_{Probe}$, may be any integer, so that statistics on the stability of the phase transition process may be extracted. In one example, there may be no $f_{Probe}$, but rather a random distribution of pulses at known times may be collected for extraction of broadband statistics. In some examples, $f_{Probe}$ may be a rational beat frequency with $f_{sweep}$ to determine and optimize sweep uniformity. In one example, the probe pulse frequency, $f_{Probe}$, is selected such that $f_{Probe}$ is synchronized with the sweeps of the annealing image 270 in the x-direction, such that a subset of synchronized moments in a set of annealing image sweeps will be probed with individual pulses, with the multiple pulses collected into a single image frame by imaging sensor 624, so that the phase transition's high-bandwidth consistency may be extracted from the melt region's contrast. In some examples, probe 602 is configured to emit pulses of light having a duration of 3 ns-20 ns, and in some examples, 5 ns-15 ns, and in some examples, 5 ns-10 ns, and in some examples, 5 ns-7 ns.

Applications 704 may also include a camera control application 710 and an image processing application 712 that include instructions for controlling camera 608, such as frame rate and shutter speed, and processing images captured by the camera. Image processing application 712 may be configured to measure the fractional shift in the reflectivity of wafer surface 12 by comparing captured images during laser processing to a reflective reference image of the wafer surface when it was below its melt temperature, e.g., at ambient temperature. When annealing image 270 causes material on or below wafer surface 12 in SOL to begin to melt, a new discontinuity in the reflectivity of the wafer surface 12 will occur. Image processing application 712 may be configured to identify the discontinuity using any of a variety of image processing algorithms. For example, one or more of fitting algorithms, edge detection algorithms, eigen-basis decompositions, feed-forward classifiers, or the detection of any intensity in a captured image frame that exceeds a threshold value associated with a maximum reflectivity of the wafer material in the solid phase, or a target intensity value corresponding to the reflectivity of a target material on the melt-side of the solid-liquid phase transition. Referring to FIG. 5 as an example, image processing application 712 may be configured to detect a size and velocity of melted region 510 by detecting a moving pair of discontinuities, e.g., discontinuities 506, 508, that correspond to a pair of phase transition boundaries, and may also be configured to determine a realtime melt phase time duration. Controller 300 may be configured to control one or more parameters of pre-heat and annealing laser systems 162, 250 to maintain the melt phase time duration at a target value.

In an example, sensor 624 may have a maximum exposure frequency that is less than $f_{Probe}$, and as noted above, $f_{Probe}$ may be less than $f_{sweep}$. As noted above, the FOV of the image imaged on sensor 624 may be significantly larger than the SOR and may contain a plurality of pre-heat line images. Thus, a single image captured by one exposer of camera 608 may contain multiple pulses of probe and many multiples of sweep annealing image 270. Image processing application 712 may utilize predetermined information on a known intensity profile of a material phase transition and extract one or more statistical correlation functions from the captured intensity of multiple probe pulses to characterize the melt process's consistency, or to act as multi-sampler on device wafers, or to act as a spatial lock-in frequency to simplify melt detection with fast fourier transforms.

Any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
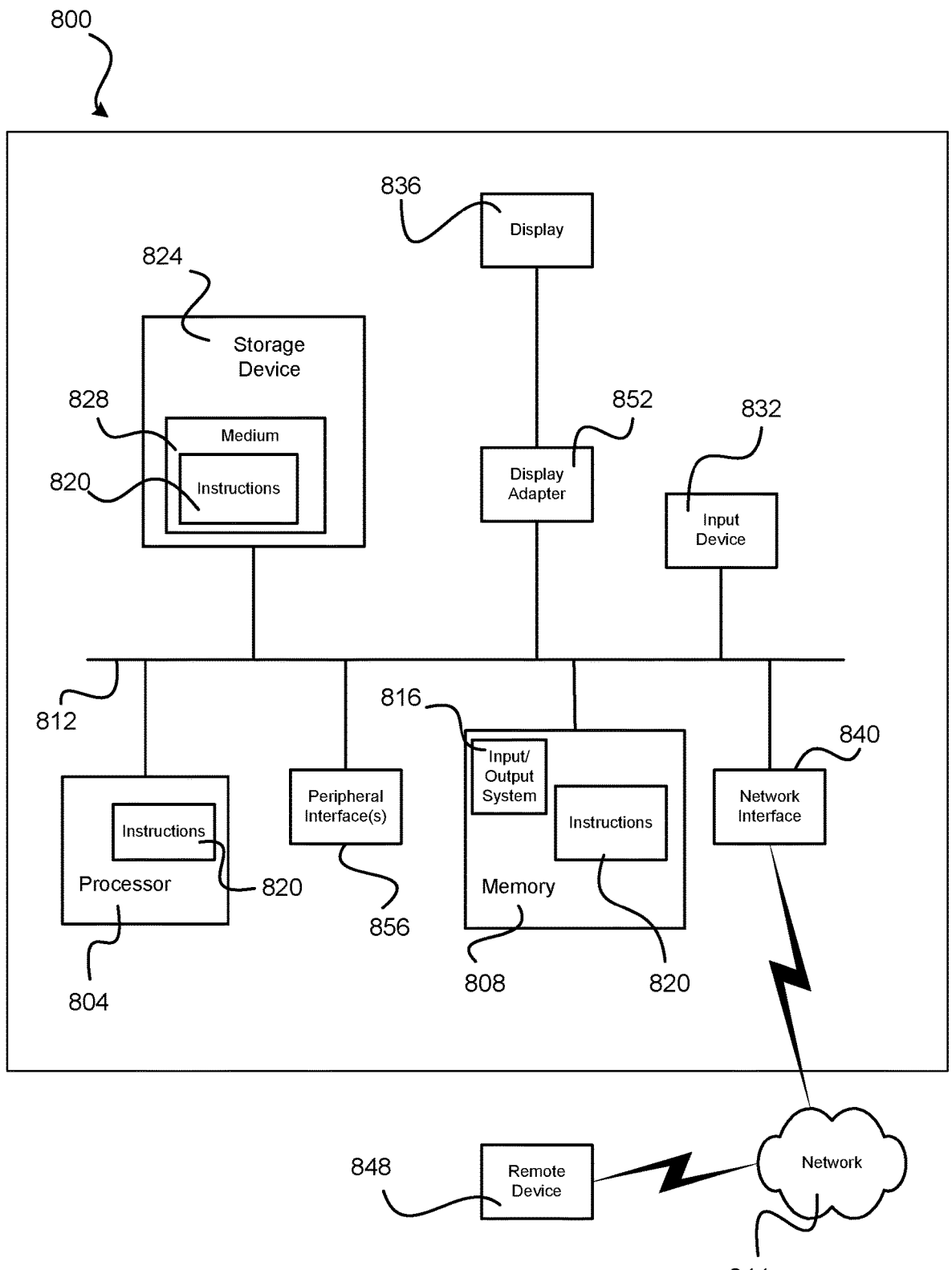
FIG. 8 is a diagram of an example computing system that may be used to implement aspects of the present disclosure.

FIG. 8 shows a diagrammatic representation of one embodiment of a computing device in the exemplary form of a computer system 800 within which a set of instructions for causing a control system, such as the controller 300 of FIGS. 1 and 7, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine-readable media) including, but not limited to, a random access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIRE-WIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

What is claimed is:

1. A method of detecting the onset of melt in a region of interest of a semiconductor surface during a laser annealing process, the method comprising:
    irradiating the semiconductor surface with pulses of radiation during the laser annealing process;
    capturing, with a pixelated image sensor, an image that captures a portion of the radiation that has reflected off of the semiconductor surface; and
    processing the image to detect a new discontinuity in an intensity of the reflected radiation in a region of interest of the image, the new discontinuity indicating the onset of melt of the semiconductor in the region of interest;
    wherein the processing includes the detection of an intensity in a captured image frame that exceeds a threshold value, the threshold value corresponding to a maximum reflectivity of the semiconductor in the solid phase, or a reflectivity of the semiconductor on a melt-side of a solid-liquid phase transition.

2. The method of claim 1, wherein the laser annealing process includes performing sequential sweeps across the semiconductor surface at a sweep frequency, $f_{sweep}$, wherein the irradiating includes emitting pulses of radiation at a pulse frequency, $f_{Probe}$, wherein $f_{Probe} < f_{sweep}$.

3. The method of claim 2, wherein $f_{Probe}$ is a rational beat frequency of $f_{sweep}$.

4. The method of claim 2, wherein $f_{Probe}$ is synchronized with $f_{sweep}$, and multiple pulses of radiation are captured in a single image frame by the pixelated image sensor.

5. The method of claim 1, wherein the irradiating includes emitting a random distribution of pulses and the processing includes applying broadband statistics to the captured images to detect the new discontinuity.

6. The method of claim 1, wherein the pixelated image sensor is a CCD or CMOS image sensor.

7. The method of claim 1, wherein the processing includes application of one or more of fitting algorithms, edge detection algorithms, eigenbasis decompositions, or feed-forward classifiers.

8. The method of claim 1, wherein the radiation is blue light.

9. The method of claim 1, wherein the radiation has a wavelength in the telecom band.

10. The method of claim 1, wherein the processing the image to detect a new discontinuity includes processing the image to detect a moving pair of discontinuities in the intensity of the reflected radiation that correspond to a melted region of the semiconductor.

11. The method of claim 10, further comprising determining a melt phase time duration from the detected pair of discontinuities and comparing the determined melt phase time duration to a target melt phase time duration.

12. A method of detecting the onset of melt in a region of interest of a semiconductor surface during a laser annealing process, the method comprising:
    irradiating the semiconductor surface with pulses of radiation;
    capturing, with a pixelated image sensor, an image that captures a portion of the radiation that has reflected off of the semiconductor surface; and
    processing the image to detect a new discontinuity in an intensity of the reflected radiation in a region of interest of the image, the new discontinuity indicating the onset of melt of the semiconductor in the region of interest;
    wherein the processing includes application of one or more of fitting algorithms, edge detection algorithms, eigenbasis decompositions, feed-forward classifiers, or the detection of any intensity in a captured image frame that exceeds a threshold value.

13. The method of claim 12, wherein the laser annealing process includes performing sequential sweeps across the semiconductor surface at a sweep frequency, $f_{sweep}$, wherein the irradiating includes emitting pulses of radiation at a pulse frequency, $f_{Probe}$, wherein $f_{Probe} < f_{sweep}$.

14. The method of claim 13, wherein $f_{Probe}$ is a rational beat frequency of $f_{sweep}$.

15. The method of claim 13, wherein $f_{Probe}$ is synchronized with $f_{sweep}$, and multiple pulses of radiation are captured in a single image frame by the pixelated image sensor.

16. The method of claim 12, wherein the irradiating includes emitting a random distribution of pulses and the processing includes applying broadband statistics to the captured images to detect the new discontinuity.

17. The method of claim 12, wherein the radiation is blue light or has a wavelength in the telecom band.

18. The method of claim 12, wherein the processing the image to detect a new discontinuity includes processing the image to detect a moving pair of discontinuities in the intensity of the reflected radiation that correspond to a melted region of the semiconductor.

19. The method of claim 18, further comprising determining a melt phase time duration from the detected pair of discontinuities and comparing the determined melt phase time duration to a target melt phase time duration.

20. A method of detecting the onset of melt in a region of interest of a semiconductor surface during a laser annealing process, the method comprising:
    irradiating the semiconductor surface with pulses of radiation;
    capturing, with a pixelated image sensor, an image that captures a portion of the radiation that has reflected off of the semiconductor surface; and
    processing the image to detect a new discontinuity in an intensity of the reflected radiation in a region of interest of the image, the new discontinuity indicating the onset of melt of the semiconductor in the region of interest;
    wherein the processing the image to detect a new discontinuity includes processing the image to detect a moving pair of discontinuities in the intensity of the reflected radiation that correspond to a melted region of the semiconductor.

21. The method of claim 20, wherein the laser annealing process includes performing sequential sweeps across the semiconductor surface at a sweep frequency, $f_{sweep}$, wherein the irradiating includes emitting pulses of radiation at a pulse frequency, $f_{Probe}$, wherein $f_{Probe} < f_{sweep}$.

22. The method of claim 21, wherein $f_{Probe}$ is a rational beat frequency of $f_{sweep}$.

23. The method of claim 21, wherein $f_{Probe}$ is synchronized with $f_{sweep}$, and multiple pulses of radiation are captured in a single image frame by the pixelated image sensor.

24. The method of claim 20, wherein the irradiating includes emitting a random distribution of pulses and the processing includes applying broadband statistics to the captured images to detect the new discontinuity.

25. The method of claim 20, wherein the radiation is blue light or has a wavelength in the telecom band.

26. The method of claim 20, further comprising determining a melt phase time duration from the detected pair of discontinuities and comparing the determined melt phase time duration to a target melt phase time duration.

* * * * *